United States Patent
Kastalsky

(10) Patent No.: US 8,440,994 B2
(45) Date of Patent: May 14, 2013

(54) NANOTUBE ARRAY ELECTRONIC AND OPTO-ELECTRONIC DEVICES

(75) Inventor: Alexander Kastalsky, Wayside, NJ (US)

(73) Assignee: Nano-Electronic and Photonic Devices and Circuits, LLC, Bridgeport, PA (US)

( * ) Notice: Subject to any disclaimer, the term of this patent is extended or adjusted under 35 U.S.C. 154(b) by 798 days.

(21) Appl. No.: 12/011,044

(22) Filed: Jan. 24, 2008

(65) Prior Publication Data
US 2009/0189143 A1  Jul. 30, 2009

(51) Int. Cl.
*H01L 29/06* (2006.01)
(52) U.S. Cl.
USPC .......... 257/12; 257/10; 257/24; 257/E29.005; 257/E51.04; 438/585; 438/586; 438/595; 977/742; 977/750
(58) Field of Classification Search ............ 257/12, 257/774, 758, E29.005
See application file for complete search history.

(56) References Cited

U.S. PATENT DOCUMENTS

| | | | |
|---|---|---|---|
| 6,297,063 B1 | 10/2001 | Brown | |
| 6,972,467 B2 | 12/2005 | Zhang | |
| 6,998,634 B2 | 2/2006 | Cheong et al. | |
| 7,102,157 B2 | 9/2006 | Kastalsky | |
| 7,151,209 B2 | 12/2006 | Empedodes | |
| 7,211,143 B2 | 5/2007 | Yang | |
| 7,348,675 B2 * | 3/2008 | Dubin et al. | 257/774 |
| 7,470,620 B2 | 12/2008 | Dubin et al. | |
| 7,474,811 B1 | 1/2009 | Quitoriano | |
| 8,168,495 B1 * | 5/2012 | Lim et al. | 438/268 |
| 2002/0097770 A1 | 7/2002 | Mekis et al. | |
| 2002/0172820 A1 | 11/2002 | Majumdar et al. | |
| 2003/0122133 A1 | 7/2003 | Choi et al. | |
| 2004/0044235 A1 | 3/2004 | Cheron et al. | |
| 2004/0058153 A1 | 3/2004 | Ren et al. | |
| 2005/0056877 A1 | 3/2005 | Rueckes et al. | |
| 2005/0161662 A1 | 7/2005 | Majumdar et al. | |
| 2005/0167755 A1 | 8/2005 | Dubin et al. | |
| 2005/0224888 A1 * | 10/2005 | Graham et al. | 257/368 |
| 2005/0230270 A1 | 10/2005 | Ren et al. | |
| 2006/0169972 A1 | 8/2006 | Furukawa et al. | |
| 2006/0220141 A1 | 10/2006 | Besser | |

(Continued)

OTHER PUBLICATIONS

Kong et al., "Chemical Profiling of Single Nanotubes: Intramolecular p-n-p Junctions and On-Tube Single-Electron Transistors", Applied Physics Letters, 2002, 80(1), 73-75.

(Continued)

*Primary Examiner* — Minh-Loan T Tran
*Assistant Examiner* — Fazli Erdem
(74) *Attorney, Agent, or Firm* — Woodcock Washburn, LLP

(57) ABSTRACT

Carbon nanotube (CNT)-based devices and technology for their fabrication are disclosed. The discussed electronic and photonic devices and circuits rely on the nanotube arrays grown on a variety of substrates, such as glass or Si wafer. The planar, multiple layer deposition technique and simple methods of change of the nanotube conductivity type during the device processing are utilized to provide a simple and cost effective technology for a large scale circuit integration. Such devices as p-n diode, CMOS-like circuit, bipolar transistor, light emitting diode and laser are disclosed, all of them are expected to have superior performance then their semiconductor-based counterparts due to excellent CNT electrical and optical properties. When fabricated on Si-wafers, the CNT-based devices can be combined with the Si circuit elements, thus producing hybrid Si-CNT devices and circuits.

14 Claims, 7 Drawing Sheets

U.S. PATENT DOCUMENTS

| | | | |
|---|---|---|---|
| 2006/0228074 A1 | 10/2006 | Lipson et al. | |
| 2006/0237857 A1* | 10/2006 | Bertin et al. | 257/903 |
| 2007/0032051 A1 | 2/2007 | Lieber et al. | |
| 2007/0114628 A1 | 5/2007 | Barrios et al. | |
| 2007/0148963 A1* | 6/2007 | Chan et al. | 438/637 |
| 2007/0164270 A1 | 7/2007 | Majumdar et al. | |
| 2008/0157126 A1 | 7/2008 | Bertin et al. | |
| 2008/0191189 A1* | 8/2008 | Kastalsky | 257/10 |
| 2008/0315302 A1* | 12/2008 | Farrow et al. | 257/334 |
| 2009/0114903 A1* | 5/2009 | Kalburge | 257/24 |

OTHER PUBLICATIONS

Lee, "Carbon Nanotube p-n Junction Diode", Abstract submitted to the Nanotube'04 Conference, Mar. 3, 2004, available at http://materials.ipicyt.edu.mx/-nt04-abstracts/P23.html, downloaded Aug. 5, 2009.

Bonard et al, Applied Physics Letters, "Field Emission from Carbon Nanotubes: Perspectives for Applications and Clues to the Emission Mechanism", A69, Jul. 29, 1999, 245-254.

Derycke et al., "Carbon Nanotube Inter- and Intramolecular Logic Gates", Nano Letters, Aug. 26, 2001, 1(9), 453-456.

Fuhrer et al. (Kuzmany, Ed.), "Ballistic Transport in Semiconducting Carbon Nanotubes", Electronic properties of molecular nanostructures : XV International Winterschool/Euroconference, Kirchberg, Tirol, Austria, Mar. 3-10, 2001, CP591, 401-404.

Guo et al., "Carrier Transport and Light-Spot Movement in Carbon-Nanotube Infrared Emitters", Applied Physics Letters, Jan. 3, 2005, 86(023105), 1-3.

Preuss et al., "Finer Copper Wires for Faster Integrated Circuits", Berkeley Lab Currents, Aug. 7, 1998, pp. 1-3.

Boccaccini et al., "Electrophoretic Deposition of Carbon Nanotubes", Carbon, Jun. 12, 2006, 44, 3149-3160.

* cited by examiner

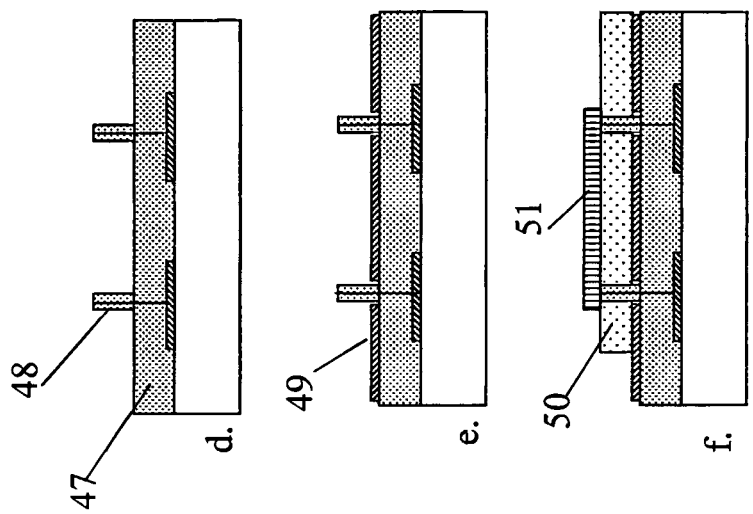
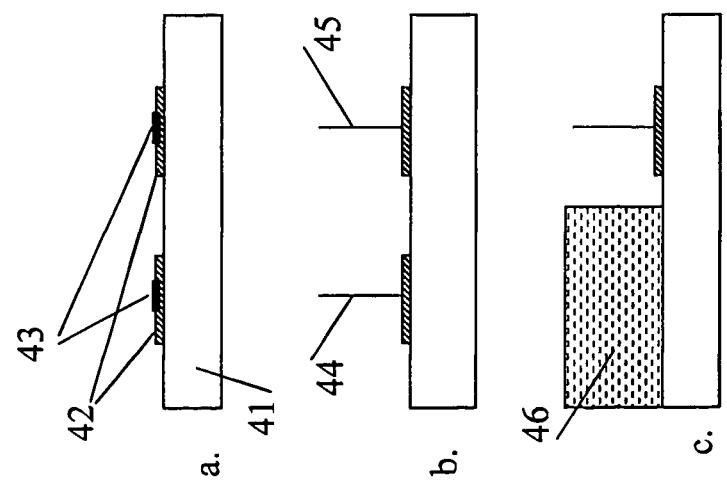
Fig.4

NANOTUBE ARRAY ELECTRONIC AND OPTO-ELECTRONIC DEVICES

FIELD OF THE INVENTION

The invention relates to carbon nanotube array of p- and n-channel transistors and p-n diodes and specifically, to complementary circuits of nanotube array field-effect transistors as well as bipolar transistors and optoelectronic devices.

BACKGROUND OF THE INVENTION

The Carbon Nanotubes (CNT) are viewed to be a new key element for future electronics. In the CNT, such unique properties as quantization of the electron spectrum, ballistic electron propagation along the tube, current densities as high as $10^9$ A/cm$^2$, existence of the semiconductor phase, possibilities for n- and p-doping with a high carrier mobilities, as well as excellent thermal conductance, make the nanotubes a great candidate for future novel high-speed, high efficiency electronic and photonic devices.

The key element widely used in the electronic logic circuits is CMOS, wherein both switching states consume minimum energy, see. e.g. J. R. Brews in High-speed Semiconductor Devices, J. Wiley &Sons, New York, p. 139, 1990. It is therefore important for future nanotube applications to reproduce such an element using CNT technology. Such attempts have been carried out in many research places worldwide.

FIG. 1a shows as a Prior Art two CNT FETs in series, with n-type and p-type channel field-effect transistors (FET) forming the CMOS circuit, see V. Derycke et al, Nano Letters 1, p. 453, 2001. The CNT CMOS is made from a single nanotube extended between source and drain metal contacts deposited on the Si substrate, while the controlling gate electrodes are made simply by placing the nanotube on top of the SiO$_2$ insulating layer on the n+Si substrate. To convert originally p-type CNT into n-type, one of the transistors has been subjected to annealing in vacuum. The resultant effect of voltage switch is shown in FIG. 1b.

The proof-of-concept design, used in the above cited work, where a single nanotube is placed on the substrate between the contacts, is utilized in essentially all publication on this topic, for both CMOS circuit and individual transistors (see also E. Ungersboeck, et al, IEEE Transactions on nanotechnology, V4, p. 533, 2005). The drawback of this method is its impracticality for any scale of circuit integration: placement of multiple identical nanotubes to enhance the output current or to form new circuit elements requires a special micromanipulator and thus precludes any possibility of IC mass manufacturing. The future success of CNT devices will rely on emergence of a cost efficient manufacturing process that will ensure a high-yield and cost efficiency above the modern CMOS technology.

The present invention discloses this technology. It is based on the growth of a controllable nanotube array on a metal electrode normally to the electrode plane and then sequential deposition of dielectric and metal layers to produce a solid platform for attachment of a second common contact to all the nanotube tips, thereby forming source and drain electrodes. The transistor gate electrode is made as a third conductive layer sandwiched between the dielectric layers and placed somewhere in the middle of the nanotube length.

Such a technology was described in the patent application Ser. No. 11/705,577 filed by A. Kastalsky on February 2007, where several nanotube array devices and method for their fabrication have been disclosed. Shown in FIG. 2 as a Prior Art, is the nanotube array FET (the direction of the nanotube array is normal to the drawing plane) in which the nanotubes are grown normally to the substrate, and the gate electrode 51 is attached to the sidewall of every nanotube 57 in the array through a layer of insulator 54. The key element is the metal layer 51 in the middle of the nanotube length, sandwiched between two insulator layers 52 and 53. During deposition of the first insulator layer 52, a thin layer of insulation material will also be deposited on the nanotube walls, thereby forming a gate insulator layer 54 around each nanotube. It is then followed by deposition of the gate metal layer 51 and the insulator layer 53. After polishing of the insulator layer 53 and exposure of the nanotube tips, the top metal layer 55 (the drain electrode) is deposited to complete the structure. Such a design of the CNT transistor, with the nanotube buried within sequentially deposited insulating and metal layers, allows realization of the planar technology for commercial manufacturing of the CNT-based integration circuits. Several nanotube array devices will be disclosed below, all of them relying on the method of planar multilayer deposition technique combined with the appropriate processing for controllable formation of p- and n-type regions along the nanotube length during the device fabrication.

Simple methods of variation of the carrier type of conductivity along the nanotube, utilized in the disclosed technology, allow simple fabrication of p-n diodes. They are expected to possess an extremely low intrinsic capacitance due to small nanotube diameter and therefore, very high operational frequency. Furthermore, p-n-p or n-p-n structures suitable for manufacturing of bipolar transistors are also within the scope of the disclosed devices.

The electron-hole injection in the forward bias direction will provide inter-band optical emission due to electron-hole radiative recombination. Below, the nanotube array Light Emitting Diodes and Lasers will be disclosed, wherein excellent optical properties of CNTs ensure high efficiency of the proposed optoelectronic devices.

The first object of the present invention is to disclose a new nanotube array circuit, analogous to Si-based CMOS logic element and the processing steps for its fabrication.

The second object of the invention is to disclose the nanotube array bipolar transistor and the technology for its fabrication.

The third object of the invention is to disclose the nanotube array p-n junction injection light emitting diode and the technology for its fabrication.

The forth object of the invention is to disclose the nanotube array injection laser and the technology for its fabrication.

BRIEF DESCRIPTION OF THE INVENTION

The above described objects of the invention essentially cover the majority of modern semiconductor electronic and optoelectronic devices: p-n diodes, transistors, CMOC switches, bipolar transistors, as well as light emitting diodes and lasers. Because of CNT outstanding electrical and optical properties, all these devices are expected to have parameters superior to their semiconductor counterparts.

According to the present invention, the discussed above planar fabrication technology is used to disclose a circuit of two nanotube arrays of transistors with different types of conductivity connected in series to form a logic element Complementary Metal Insulator Nanotube (CMIN) device similar to the Si-based Complementary Metal Oxide Semiconductor (CMOS) circuitry. As in conventional CMOS, one of the transistor arrays has nanotubes with electron conductivity, while the second transistor array has nanotubes with hole conductivity.

As discussed in the above cited publication by V. Derycke et al, the original single walled carbon nanotubes (SWCNT) are typically of p-type. The conversion into n-type occurs under annealing of nanotubes in vacuum. On the other hand, annealing in the oxygen atmosphere returns the nanotube back to p-type. Another option for p- to n-conversion is annealing of the CNTs in a potassium atmosphere.

Thus, the CMIN, according to the present invention, contains two nanotube arrays of different types of conductivity, each having a transistor structure shown in FIG. 2 as a Prior Art. The transistor arrays are connected in series through the top electrode, while the metal layer in the middle of the structure represents a common gate electrode for both arrays. This method of growth of CNT arrays in predetermined position and planar deposition of multi-layer structure, with the nanotubes being buried inside the structure, provides the device processing suitable for the large scale integration of CNT-based ICs.

Similar planar multilayer deposition technique is applied for fabrication of a new nanotube array bipolar transistor (NABT) of p-n-p and n-p-n device configurations, the change in the type of conductivity in the middle of the nanotube (transistor base) being produced using the described above methods of annealing in vacuum or in appropriate gas atmosphere. The contact to the base will be made using the same method of deposition of the metal layer sandwiched between two dielectrics, similar to the gate in the CMIN. Unlike the insulated gate of the CMIN, however, the metal in the NABT is directly attached to the nanotube sidewall to provide the base contact with a low contact resistance. To minimize the contact resistance, Pd as a contact metal is preferable, see A. Javey et al, Nano Letters, V. 4. p. 1319, 2004. The disclosed nanotube array bipolar transistor is expected to possess unique speed of operation due to both ballistic carrier travel across the base and extremely low intrinsic device capacitances.

A simple nanotube array of p-n junctions can be a very attractive new optical element. The electron-hole injection will result in a radiative recombination, and the device is expected to function as a nanotube array light emitting diode (NALED).

The excellent optical properties of the CNTs (see below) can also be used for creation of the nanotube array injection lasers (NAIL). The nanotube array "quantum wire" laser is close in its nature to the semiconductor quantum wire laser, see e.g. Book on Quantum Well Lasers, Ed. by P. S. Zory, 1993.

BRIEF DESCRIPTION OF THE DRAWINGS

FIG. 4. Processing steps for CMIN fabrication.

DETAILED DESCRIPTION OF THE INVENTION

1. Design and Fabrication of CMIN

Figure 1:
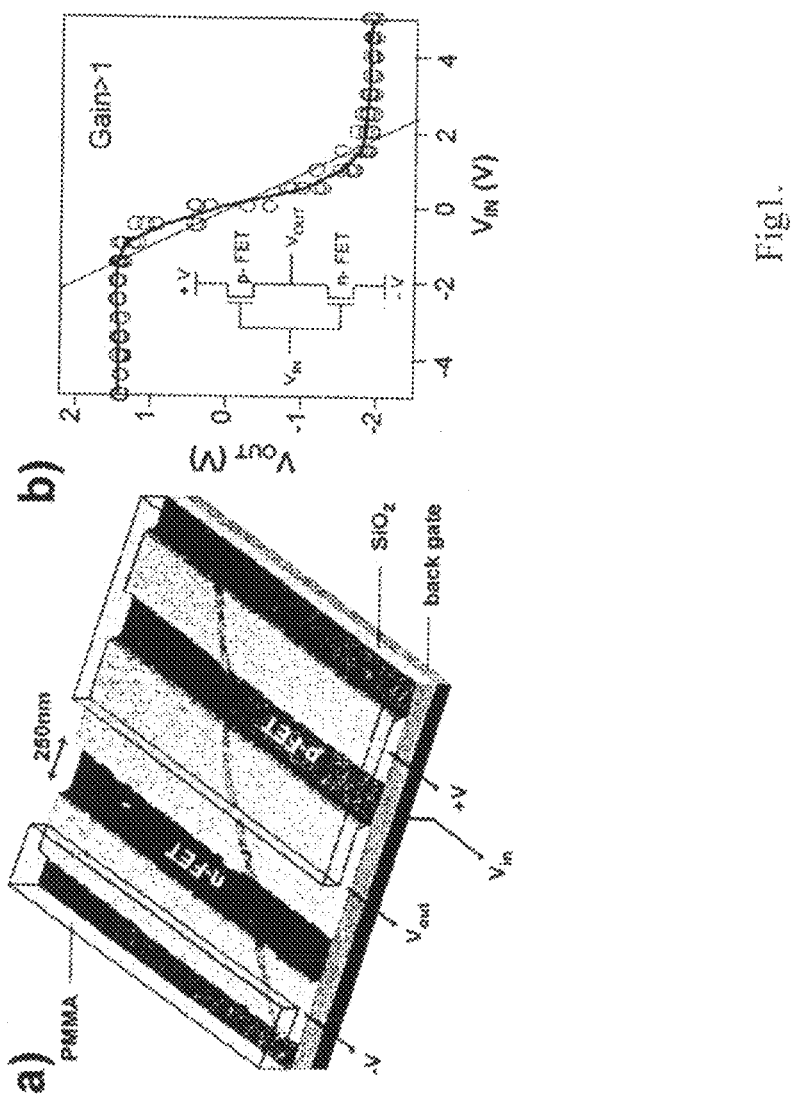
FIGS. 1a and 1b illustrate a CNT CMOS circuit made from a single horizontally oriented nanotube extended between source and drain metal contacts deposited on a Si substrate (FIG. 1a) and the resultant voltage switch effect (FIG. 1b).
Figure 2:
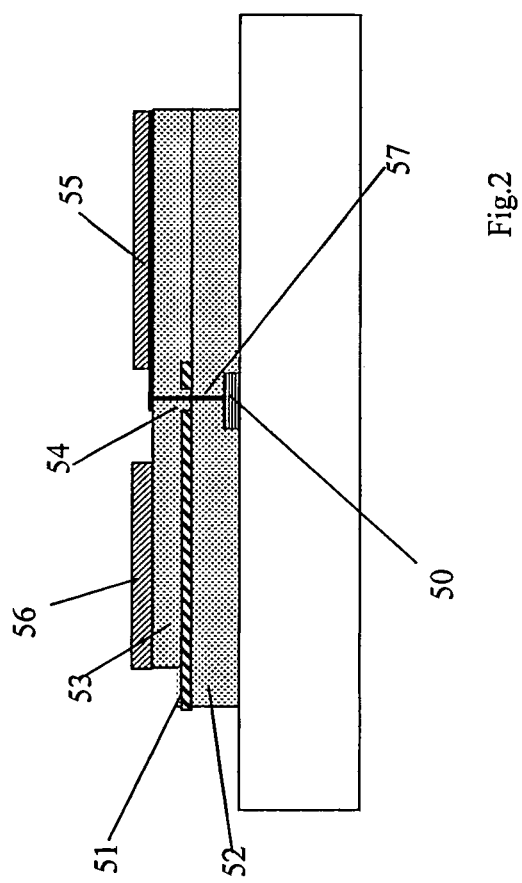
FIG. 2 illustrates a nanotube configuration discussed in patent application Ser. No. 11/705,577 (U.S. Pat. No. 7,851,784).
Figure 3:
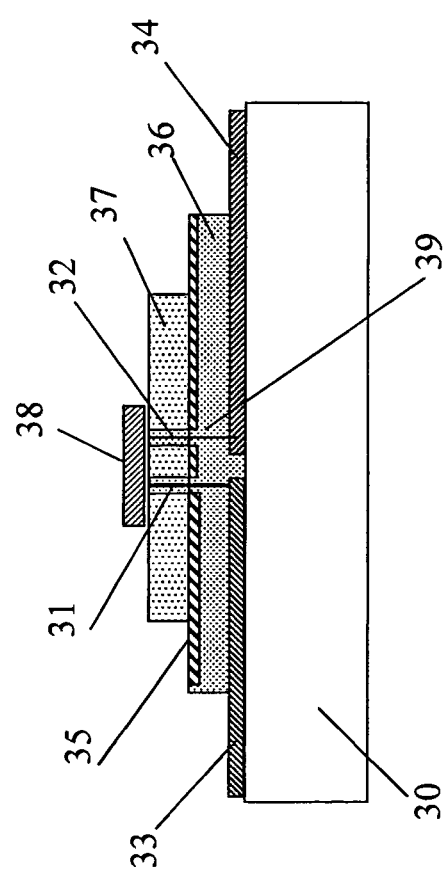
FIG. 3. Cross-sectional view of the CMIN structure.

In the CMIN design, shown in FIG. 3a, two arrays of the nanotubes 31 and 32 are grown on two separate metal electrodes 33 and 34 normally to the substrate 30, which can be glass plate or Si wafer or any other dielectric substrate capable of sustaining nanotube growth temperatures (~600° C.). The nanotube arrays have different types of conductivity, which are produced using above discussed methods of the type conversion. Let as assume that nanotubes 31 are p-type and nanotubes 32 are n-type, although reverse type assignment is equally applicable, since the CMIN structure is symmetrical. The metal layer 35 sandwiched between two dielectric layers 36 and 37 represents a common gate for two transistors, wherein the first transistors comprises the substrate metal 33 as a source, the nanotube array 31 as a conducting p-channel and the top metal layer 38 as a drain, while the same top metal layer 38 is a source of the second transistor, the nanotube array 32 is an n-channel and substrate metal 34 is a drain. The dielectric layer 39 provides the electrical insulation of the gate metal 35 to both transistor channels.

If the p-channel (array 31) is originally conducting and n-channel (array 32) is depleted, a positive voltage to the gate metal 35 will make n-channel conducting and p-channel depleted, so that the output voltage taken from the connecting metal electrode 38 will be switched from minimum to maximum amplitude if positive voltage Vdd is applied to the drain electrode 34 of the n-channel transistor relative to the source electrode 33 of the p-channel transistor. On the other hand, change of the polarity of Vdd will result in switching the output voltage from its maximum to minimum amplitude at the same positive gate voltage.

A single nanotube from each array 31 and 32 can form two nanotube CMIN circuit. Due to sustainable current density in the SWCNT of $10^9$ cm$^{-2}$, the two nanotube CMIN can provide the current switch of 10 µA. With a realistic nanotube spacing in the array of 1 µm, a 100 µm-long and nanotube diameter wide array will provide 1 mA output current switch, sufficient for IC operations.

FIG. 4 shows the processing steps for the CMIN fabrication. It begins from deposition on the substrate 41 of two arrays of metal pads 42 to form first source and drain contacts in predetermined positions, FIG. 4a. As mentioned above, the layer of Pd is preferable since it provides the lowest contact resistance. It is followed by a placement on the contacts 42 of small pads 43 of catalytic material, such as Co, Ni or Fe, needed for the nanotube growth. After growth of the nanotube arrays 44 and 45, see FIG. 4b, which are normally have p-type conductance, one of the arrays, 44, is protected by deposition of the sacrificial dielectric layer 46, see FIG. 4c, while another nanotube array 45 remains exposed and is annealed in vacuum or in potassium atmosphere to convert it into n-type. Then the sacrificial layer 46 is removed, and two arrays 44 and 45 of respective p- and n-types are ready for further processing. FIG. 4d shows the dielectric layer 47 which is deposited on the substrate and covers the metal electrodes with the nanotubes. At the same time, a thin dielectric layer 48 also coats the side walls of the nanotubes. The metal layer 49 deposited atop of the dielectric 47 represents the common gate electrode for both arrays, see FIG. 4e, while the layer 48 of FIG. 4d is the gate insulator. Then the second dielectric layer 50 covers the nanotube arrays, see FIG. 4f. This layer provides a platform for placement of the top contacts to the transistors. It is preferable to make the layer 50 thin enough to have the nanotube ends slightly protruded above this layer. After polishing, to remove the nanotube ends, the final metal layer 51 is deposited on the exposed nanotube ends to connect the arrays into the circuit of two transistor arrays and form the other two source and drain contacts for transistor circuit. Again, the Pd layer is preferable. Thus, according to the present invention, the planar technology of sequential deposition of dielectric and metal layers allows fabrication of the CMIN circuitry.

The fundamental advantages of the CMIN devices, beyond simplicity of its fabrication, is absence of any physical limits for performance improvement. In the Si world, quantum mechanical laws preclude the current rate of reduction in transistor feature size (gate length), and in order to continue improvements in device speed and cost per chip at present pace it is necessary to develop new switching circuits wherein these limitations are not at work. In the CMIN design, with gate plane intersecting the nanotube cylinder, these limitations are not applicable. The gate length in this case is controlled essentially by the gate metal thickness and can be made very thin without complication in the device processing. On the other hand the gate insulator coating the nanotube sidewalls can also be made very thin. Finally, the carriers in the short nanotube transistor channel will move ballistically, i.e. with a velocity significantly exceeding the saturated carrier velocity in the Si channel of $\sim 10^7$ cm/s. This implies that CMIN looks the best candidate for future replacement of Si-based transistors. On the other hand, Si wafer can be used as a substrate for CMIN fabrication, and therefore Si-based and CNT-based devices can merge into integrated hybrid ICc.

2. Design and Fabrication of NABT

Figure 5:
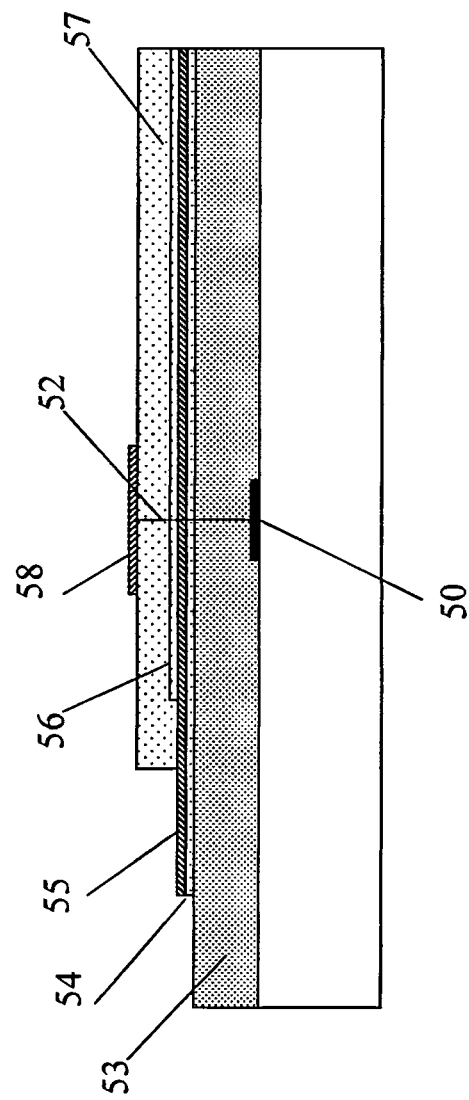
FIG. 5. Cross-sectional view of the NABT structure.

The NABT structure contains the nanotubes, in which the conductivity within a short distance in the middle of the nanotube is converted into the opposite type to form a transistor base. FIG. 5 illustrates the NABT structure. It starts from deposition of the emitter contact 50 on which the nanotube array 52 is grown. It is followed by deposition of four dielectric layers, 53, 54, 56 and 57 and the metal layer 55 which is sandwiched between two thin dielectric films 54 and 56.

After deposition of the layer 53, the nanotubes are subjected to above discussed procedures for converting the type of conductivity. For example, if the p-n-p NABT is considered, after completion of the layer 53, the nanotubes are cleaned up to remove a thin layer of insulator from the nanotube sidewalls and annealed in vacuum to convert uncovered nanotubes into n-type. Then a thin dielectric layer 54 is deposited to ensure that the metal layer 55 has a contact within the n-type region. After deposition of the protective dielectric film 56, the nanotubes are cleaned and annealed again, this time in the air, to return the uncovered nanotubes back to p-type. Hence, the length of the n-type region (base "thickness") is controlled by the total thickness of the layers 54, 55 and 56. After deposition of the last dielectric layer 57, the device surface is polished to expose the nanotube ends, and finally the metal layer 58 (collector) completes the structure.

Similar processing steps can be done for the n-p-n type device configuration. In this case, starting from the n-type nanotubes, the base region can be converted into p-type by annealing the nanotubes in the air, and the collector part of the nanotubes is converted back to n-type by annealing in vacuum.

The NABT is expected to possess superior properties than classical Si bipolar transistor. First, the base length determined by the thickness of the three layers 54, 55 and 56 can be made very short $\sim$20-30 nm. This length is sufficiently short to expect a ballistic carrier movement along the nanotube or at least within a part of it, see. e.g. A. Javey et al. Nano Letters, V. 4, p. 1319, 2004. This implies much higher carrier speed than that in a classical semiconductor transistor base. In addition, due to miniature nanotube size the intrinsic transistor capacitances will be minimized. Finally, there is no potential drop across the nanotube diameter, which precludes any effects of "current crowding", when the transistor efficiency in the center of the device decreases due to a lateral potential drop across the base, see. e.g. S. Sze, Physics of Semiconductor Devices, J. Wiley & Sons, NY, 1969.

3. Design and Fabrication of NALED

Simple methods of variation of the carrier type of conductivity along the grown nanotube allows fabrication of p-n diode arrays. They are expected to possess an extremely low intrinsic capacitance due to small nanotube diameter and therefore, very high operational frequency.

Electron-hole injection in the forward bias direction will produce an interband photon emission. Two-dimensional quantization of electron and hole energy in the nanotube (i.e. "quantum wire" effect), with the density of states peaking at the quantum levels, ensures a high light emission efficiency, see E. Kapon, Proc. IEEE, 80, p. 398, 1992 and Book on Quantum Well Lasers, Ed. by P. S. Zory, 1993, p. 461. In addition, the nanotubes are calculated to have oscillator strength orders of magnitude larger than that in conventional direct gap semiconductors, see V. Perebeinos et al, Phys. Rev. Lett. 94, 086802, 2005. These features suggest an extremely high optical efficiency in the NALED.

Figure 6:
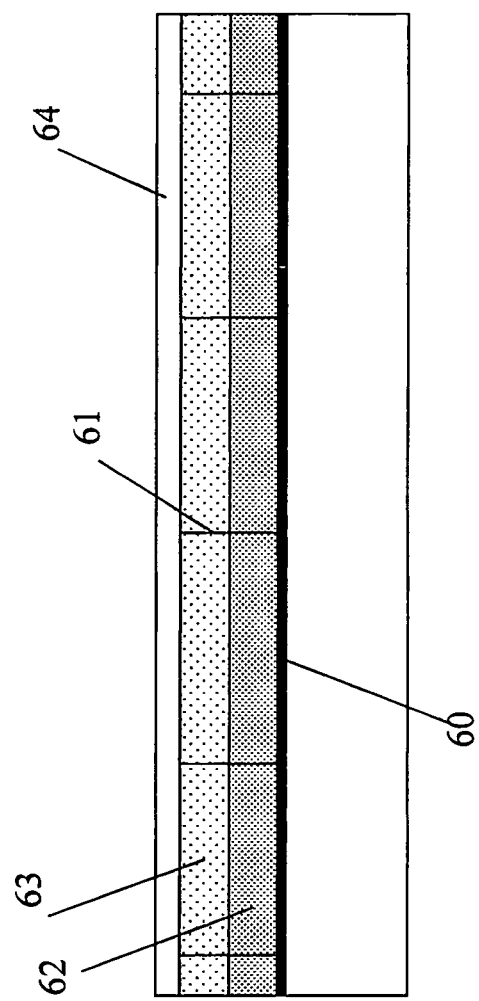
FIG. 6. Cross-sectional view of the NALED structure.

FIG. 6 shows the NALED structure. It starts from deposition of the metal electrode 60 on which the nanotube matrix 61 is grown in the predetermined pattern: it can be made as a linear array or as a two-dimensional matrix, as shown in FIG. 6. The metal layer 60 is made from material having a high optical reflection, such as Al. The metal pads of Pd are then deposited (not shown), to minimize the contact resistance, and the small pads of the catalytic material are deposited to facilitate the nanotube growth (not shown). The thickness of the first dielectric layer 62 reaches approximately a half of the nanotube length. At this stage, the remaining exposed nanotube parts are cleaned, and change of the nanotube type of conductivity is made using the above discussed methods of p-to-n and n-to-p conversions, thus forming a p-n junction. The second dielectric layer 63 is then deposited, and the top surface is polished to expose the nanotube ends. It is followed by deposition of the optically transparent conductive layer of ITO 64 to provide both the top contact to the nanotubes and optical transparency for the surface light emission.

It is important that the light radiating nanotubes are much smaller in size than the expected light wavelength. Therefore, light will be freely emitted from the nanotubes without any internal light reflections, in contrast with a conventional LED where due to internal light reflections typically only $\sim$5% of light is released, see e.g. R. H. Saul et al, LED Device Design, Semiconductors and Semimetals, v. 22, p. 193, Part C, 1985, unless special measures are undertaken to minimize this effect. In the NALED, having the light reflecting bottom metal layer 60, almost 100% of light output will be emitted upward. In addition, other factors adversely affecting the light power in the semiconductor LED, such as interfacial non-radiative recombination or self-absorption in the heterostructure, do not exist in the NALED. Finally, the fabrication technology for NALED is immeasurably simpler than that for a classical LED, where a multilayer lattice matched semiconductor heterostructure must be epitaxially grown and then carefully processed. Even a single nanotube can be used as a light emitter. For a sustainable current of $10^{-5}$ A (equivalent to the current density of $\sim 10^9$ A/cm$^2$ in a single walled nanotube), the applied voltage of $\sim$2V and a conservatively chosen light efficiency of 10%, one obtains the output light power of ~2 µW from a single nanotube. For the matrix of 100×100 nanotubes, 1 µm apart, it translates into a light power of 20 mW and the light power density of 200 W/cm², unachievable for the existing LEDs.

In the NALED of FIG. 6, the light output is directed into the top hemisphere through the transparent electrode ITO, thus making a surface emitting LED configuration. On the other hand, the light wave can propagate along the substrate plane. To minimize the light interaction with the metal electrodes, a specific wave guiding structure should be built using a combination of the dielectric layers having different index of refraction, such as $SiO_2$ and $Si_3N_4$, see below. In this case, the top contact layer 64 can be made from Pd.

4. Design and Fabrication of the NAIL

Excellent expected optical efficiency of the nanotubes produces attractive conditions for the CNT quantum wire laser activity: peaking density of states at the quantum levels make the carrier population inversion quite plausible. In comparison with the existing semiconductor heterostructure quantum wire lasers, see aforementioned citations of E. Kapon, the CNT exhibits significantly more pronounced effect of quantization due to much smaller size of the quantum wire (nanotube diameter): ~100 nm for semiconductor case vs. ~1 nm for SWCNT. High calculated oscillator strength at the energy gap in the CNT, much higher than that in the semiconductors, would provide lower threshold for lasing. Finally, the NAIL technology is simple and far less expensive than that of the semiconductor-based quantum wire lasers.

Figure 7:
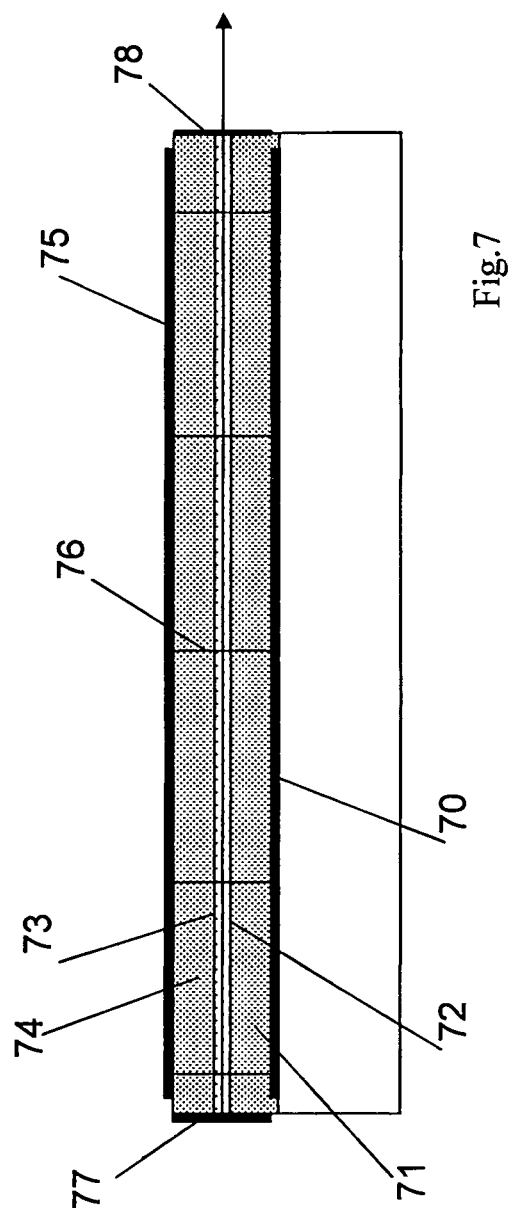
FIG. 7. Cross-sectional view of the NAIL structure.

FIG. 7. shows the NAIL structure. The nanotube matrix 76 is grown on the metal layer 70. It is preferable to use Pd layer to minimize the contact resistance. Then four dielectric layers 71, 71, 73 and 74 are deposited to form the core of the waveguide (72 and 73) and two cladding layers 73 and 74 for efficient light propagation parallel to the substrate plane. The thin identical layers 72 and 73 of the core have the index of refraction $n_c$ larger than that of the cladding layers 73 and 74, $n_{cl}$.

After deposition of the half of the waveguide, i.e. layers 71 and 72, the type of conductivity in the exposed nanotube array is altered by the earlier discussed methods to obtain a p-n junction along the nanotubes, with the change of conductivity occurring in the middle of the nanotube length. Then two other layers, 73 and 74, complete the waveguide structure. After polishing the top dielectric 74, to expose the nanotube ends, the top contact layer 75, preferably Pd, is deposited.

The optimal thickness D of the total core layer composed of the layers 72 and 73, depends on the difference of the refractive indices, $n_c-n_{cl}$, and the wavelength λ. The fraction of the light intensity contained within the core, Γ, is given by, see e.g. J. P. Leburton et al, J. Vac. Sci. Technol. B1, 415, 1983:

$$\Gamma=(2\pi^2 D2)/\lambda^2(n_c^2-n_{cl}^2)$$

Using the $Si_3N_4$ material for the core layers 72 and 73, with $n_c$=2.5, and $SiO_2$ material for the cladding layers 71 and 74, with $n_{cl}$=1.46, one obtains for λ~1 µm and Γ~1, D~200 nm. The cladding layers 71 and 74, 2 µm each, make the total laser structure thickness of ~4.2 µm. Under these conditions, the laser wave strongly decays within cladding layers and practically does not interact with the contact layers 70 and 75. Two mirrors 77 and 78 at the ends of the laser bar are then deposited to make a Fabri-Perot resonator. It is also important that in the NAIL optical loss through free-carrier absorption is minimized since the interaction of the laser wave with conductive media occurs only at the nanotubes occupying extremely small device volume.

The NAIL structure without the mirrors 77 and 78 will operates as the LED with light propagation within the waveguide structure parallel to the substrate plane.

Thus, the disclosed technology unites together two different industries: electronics, normally relying on Si as a material for ICs, and opto-electronics, typically employing III-V heterostructure materials. The proposed CNT-based devices and fabrication methods cover both these worlds: the new disclosed electronic and photonic devices can be combined on the same substrate, which can be a Si wafer or a piece of glass. The performance of these devices is expected to be greater than that of their semiconductor counterparts, largely due to excellent nanotubes properties, while the manufacturing cost is expected to be significantly lower.

The disclosed technology, according to the present invention, can be characterized by several key features, such as:
1. The nanotube arrays are grown normally to the substrate plates in predetermined positions and with controlled height;
2. The planar multiple layer dielectric and metal deposition technique is the basic process for device fabrication;
3. The CNTs allow simple methods of p-to-n and n-to-p type conversion;
4. CNTs can be grown on a variety of substrates, from Si wafer, to piece of glass or ceramics.

All these features open up the opportunity for mass production of the new classes of electronic and photonic devices with potentially great performance at low cost.

The invention claimed is:

1. A Complementary Metal Insulator Nanotube circuit comprised of the following elements:
   dielectric substrate with deposited first and second spatially separated metal layers on which two single-walled carbon nanotube arrays are grown, and one of the single-walled carbon nanotube arrays is converted into opposite conductivity type, so that one of said single-walled carbon nanotube arrays is of p-type, while another one is of n-type;
   first dielectric layer covering said first and second metal layers, a half length of the single-walled carbon nanotubes and partially sidewalls of the nanotubes;
   third metal layer covering said first dielectric layer and reaching said first dielectric layer on said sidewalls of the single-walled carbon nanotubes in both said nanotube arrays;
   second dielectric layer deposited on top of said third metal layer and making the total thickness of all deposited metal and dielectric layers smaller than the single-walled carbon nanotube length, so that the single-walled carbon nanotubes protrude above said second dielectric layer;
   fourth metal layer which covers said two single-walled carbon nanotubes arrays and is deposited on the second dielectric layer after polishing the surface of said second dielectric layer, to remove the protruded single-walled carbon nanotube ends and expose the single-walled carbon nanotube tips, so that said fourth metal layer connects both said single-walled carbon nanotube arrays and thus makes a circuit of two transistors in series, wherein said third metal layer functions as a gate electrode to both transistor in the circuit, while said first dielectric layer deposited on said sidewalls of the single-walled carbon nanotubes plays a role of the gate insulator;
   such that the single-walled carbon nanotubes are in physical contact with each of the first and second dielectric layers and the gate insulator.

2. The Complementary Metal Insulator Nanotube circuit of claim 1, wherein the conversion of originally p-type single-walled carbon nanotubes into n-type is made by annealing the single-walled carbon nanotubes in vacuum, while the conversion of the originally n-type single-walled carbon nanotubes into p-type is made by annealing the single-walled carbon nanotubes in air.

3. The Complementary Metal Insulator Nanotube circuit of claim 1, wherein said first, second and fourth metal layers are made from Palladium (Pd).

4. A Complementary Metal Insulator Nanotube circuit comprising:
    (a) a dielectric substrate onto which a first and a second spatially separated metal layers are superposed;
    (b) a first array of p-type vertical single-walled carbon nanotubes positioned substantially perpendicularly to and in electrical communication with said first spatially separated metal layer, said array comprising at least one p-type single-walled carbon nanotube;
    (c) a second array of n-type vertical single-walled carbon nanotubes positioned substantially perpendicularly to and in electrical communication with said second spatially separated metal layer, said array comprising at least one n-type single-walled carbon nanotube;
    (d) a first dielectric layer covering said first and second metal layers, having a thickness of about half the length of said vertical single-walled carbon nanotubes of the first and second arrays so as to embed the lower half of the first and second arrays, and said first dielectric layer also providing a coating on the sidewalls of at least part of the upper remaining half of the vertical single-walled carbon nanotubes of the first and second arrays of sufficient thickness and length as to act as a gate insulator to a third metal layer;
    (e) the third metal layer covering said first dielectric layer and reaching said first dielectric layer on said sidewalls of the single-walled carbon nanotubes in both sets of vertical nanotube arrays, so as to be capable of acting as a gate electrode to the device;
    (f) a second dielectric layer deposited on top of said third metal layer and making the total thickness of all deposited metal and dielectric layers the same length of the lengths of the first and second single-walled carbon nanotube arrays; and
    (g) a fourth metal layer deposited on the second dielectric layer and in electrical communication with both first and second arrays of vertical single-walled carbon nanotubes, so that said fourth metal layer connects both sets of said single-walled carbon nanotube arrays and thus makes a circuit of two transistors in series;
    such that the single-walled carbon nanotubes are in physical contact with each of the first and second dielectric layers and the gate insulator.

5. The Complementary Metal Insulator Nanotube circuit of claim 1, wherein at least one nanotube array consists of one single-walled carbon nanotube in electrical communication between the first and fourth metal layers.

6. The Complementary Metal Insulator Nanotube circuit of claim 1, wherein each nanotube array comprises two or more single-walled carbon nanotubes in electrical communication between the first and fourth metal layers.

7. The Complementary Metal Insulator Nanotube circuit of claim 4, wherein at least one nanotube array consists of one single-walled carbon nanotube in electrical communication between the first and fourth metal layers.

8. The Complementary Metal Insulator Nanotube circuit of claim 4, wherein each nanotube array comprises two or more single-walled carbon nanotubes in electrical communication between the first and fourth metal layers.

9. A method of making a Complementary Metal Insulator Nanotube circuit comprising:
    (a) depositing first and second spatially separated metal layers upon a dielectric substrate, then;
    (b) growing a first vertical nanotube array on the first metal layer and a second vertical nanotube array on the second spatially separated metal layer, each nanotube array having the same conductivity type, and each vertical nanotube array having at least one vertical nanotube, then;
    (c) converting one of the nanotube arrays into the opposite conductivity type, to give rise to a p-type nanotube array and an n-type nanotube array, then;
    (d) providing a first dielectric layer covering said first and second metal layers, a half length of the nanotubes and partially sidewalls of the nanotubes, then;
    (e) providing a third metal layer covering said first dielectric layer and reaching said first dielectric layer on said sidewalls of the nanotubes in both said nanotube arrays, then;
    (f) providing a second dielectric layer deposited on top of said third metal layer and making the total thickness of all deposited metal and dielectric layers smaller than the nanotube length, to give rise to nanotube ends protruding above said second dielectric layer, then;
    (g) removing the protruding nanotube ends; and then
    (h) providing a fourth metal layer covering said first and second vertical nanotube arrays, the fourth metal layer being deposited on the second dielectric layer, the fourth metal layer electrically connecting the first and second vertical nanotube arrays to give rise to a circuit of two transistors in series;
    wherein said third metal layer is capable of functioning as a gate electrode of the two transistors in the circuit, and said first dielectric layer deposited on said sidewalls of the nanotubes is capable of functioning as a gate insulator of the two transistors in the circuit.

10. The method of claim 9, wherein each of the first and second vertical nanotube arrays comprises semiconductor-type single walled carbon nanotubes.

11. The method of claim 10, wherein at least one of the first and second vertical nanotube arrays comprises one semiconductor-type single-walled carbon nanotube in electrical communication between the first and fourth metal layers.

12. The method of claim 10, wherein each of the first and second vertical nanotube arrays comprises two or more semiconductor-type single-walled carbon nanotubes in electrical communication between the first and fourth metal layers.

13. The method of claim 10, further comprising depositing catalytic pads on the first and second metal layers, from which the first and second vertical nanotube arrays are grown.

14. A Complementary Metal Insulator Nanotube circuit made by the process of claim 9.

* * * * *